(12) United States Patent
Baba et al.

(10) Patent No.: US 9,991,379 B1
(45) Date of Patent: Jun. 5, 2018

(54) SEMICONDUCTOR DEVICE WITH A GATE INSULATING FILM FORMED ON AN INNER WALL OF A TRENCH, AND METHOD OF MANUFACTURING THE SAME

(71) Applicant: SANKEN ELECTRIC CO., LTD., Niiza-shi, Saitama (JP)

(72) Inventors: Ryohei Baba, Niiza (JP); Tomonori Hotate, Nizza (JP); Satoru Washiya, Niiza (JP); Hiroshi Shikauchi, Niiza (JP); Youhei Ohno, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days. days.

(21) Appl. No.: 15/354,976

(22) Filed: Nov. 17, 2016

(51) Int. Cl.
*H01L 29/78* (2006.01)
*H01L 29/66* (2006.01)
*H01L 29/10* (2006.01)
*H01L 29/06* (2006.01)
*H01L 21/02* (2006.01)
*H01L 29/40* (2006.01)

(52) U.S. Cl.
CPC .... *H01L 29/7813* (2013.01); *H01L 21/02233* (2013.01); *H01L 29/0623* (2013.01); *H01L 29/1095* (2013.01); *H01L 29/66734* (2013.01)

(58) Field of Classification Search
CPC ........... H01L 29/4236; H01L 29/42376; H01L 29/66674–29/66734; H01L 29/7801–29/7802; H01L 29/7816; H01L 29/7825; H01L 29/407; H01L 29/0623; H01L 29/66068; H01L 29/7813; H01L 29/1095; H01L 29/1608; H01L 29/66325; H01L 29/7302; H01L 29/7393; H01L 29/7395; H01L 29/7397; H01L 2924/13055; H01L 29/0619
See application file for complete search history.

(56) References Cited

U.S. PATENT DOCUMENTS 4,618,872 A * 10/1986 Baliga ................... H01L 23/522
257/140
7,521,755 B2 * 4/2009 Takahashi ........... H01L 29/0696
257/330

(Continued)

FOREIGN PATENT DOCUMENTS

JP        2001-210821        8/2001

*Primary Examiner* — Maliheh Malek
(74) *Attorney, Agent, or Firm* — Banner & Witcoff, Ltd.

(57) ABSTRACT

A semiconductor device includes a semiconductor substrate, which includes: a drift region that has a first conductivity type; a body region that has a second conductivity type and is formed on the drift region; and an impurity region that has the first conductivity type and is formed inward from a surface of the body region. The semiconductor device further includes a trench, which is formed on a front surface of the semiconductor substrate and reaches the drift region; a control electrode, which is formed in the trench; an oxide film, which is formed between an inner wall of the trench and the control electrode; an electrode, which is connected to the impurity region; and a transistor, which includes a nitride film formed on the front surface of the semiconductor substrate excluding an upper side of the control electrode and a formation position of the electrode, in the semiconductor substrate.

8 Claims, 5 Drawing Sheets

(56) References Cited

U.S. PATENT DOCUMENTS

| | | | | |
|---|---|---|---|---|
| 7,880,227 B2* | 2/2011 | Takahashi | | H01L 29/0696 257/330 |
| 8,013,340 B2* | 9/2011 | Schmidt | | H01L 23/3171 257/63 |
| 8,334,563 B2* | 12/2012 | Takahashi | | H01L 27/0629 257/328 |
| 8,901,639 B2* | 12/2014 | Ryu | | H01L 29/7811 257/328 |
| 9,660,046 B2* | 5/2017 | Aoi | | H01L 29/66348 |
| 2003/0042556 A1* | 3/2003 | Gajda | | H01L 29/1095 257/401 |
| 2006/0157779 A1* | 7/2006 | Kachi | | H01L 29/66727 257/330 |
| 2010/0019314 A1* | 1/2010 | Kachi | | H01L 29/42372 257/330 |
| 2010/0025693 A1* | 2/2010 | Malhan | | H01L 29/063 257/76 |
| 2012/0049187 A1* | 3/2012 | Haruyama | | H01L 29/66734 257/49 |
| 2012/0097980 A1* | 4/2012 | Masuda | | H01L 29/0615 257/77 |
| 2012/0112240 A1* | 5/2012 | Takeda | | H01L 29/0873 257/133 |
| 2012/0132954 A1* | 5/2012 | Kouno | | H01L 29/0619 257/140 |
| 2012/0146055 A1* | 6/2012 | Mitani | | H01L 29/0619 257/77 |
| 2012/0228634 A1* | 9/2012 | Sugi | | H01L 29/0619 257/77 |
| 2013/0075760 A1* | 3/2013 | Takaya | | H01L 29/0623 257/77 |
| 2013/0248981 A1* | 9/2013 | Okumura | | H01L 29/42368 257/329 |
| 2013/0313576 A1* | 11/2013 | Nakano | | H01L 29/8611 257/77 |
| 2014/0206162 A1* | 7/2014 | Eguchi | | H01L 29/66712 438/268 |
| 2014/0239388 A1* | 8/2014 | Lee | | H01L 27/0629 257/334 |
| 2014/0264562 A1* | 9/2014 | Cheng | | H01L 29/7827 257/330 |
| 2014/0361312 A1* | 12/2014 | Yoshikawa | | H01L 29/41766 257/76 |
| 2015/0021623 A1 | 1/2015 | Lichtenwalner et al. | | |
| 2015/0115286 A1* | 4/2015 | Takeuchi | | H01L 21/8213 257/77 |
| 2015/0144995 A1* | 5/2015 | Takahashi | | H01L 29/7397 257/139 |
| 2015/0214353 A1* | 7/2015 | Yamada | | H01L 29/66068 257/77 |
| 2015/0228723 A1* | 8/2015 | Werber | | H01L 29/0619 257/140 |
| 2015/0270385 A1* | 9/2015 | Shimomura | | H01L 29/7813 257/334 |
| 2015/0340443 A1* | 11/2015 | Wada | | H01L 29/0623 257/77 |
| 2016/0141371 A1* | 5/2016 | Tega | | H01L 21/0465 257/77 |
| 2016/0163800 A1* | 6/2016 | Sakai | | H01L 29/0657 257/77 |
| 2016/0181415 A1* | 6/2016 | Masuda | | H01L 29/66068 257/77 |
| 2017/0018643 A1* | 1/2017 | Takaya | | H01L 29/4236 |
| 2017/0133518 A1* | 5/2017 | Li | | H01L 29/8122 |
| 2017/0154953 A1* | 6/2017 | Wada | | H01L 29/063 |
| 2017/0263739 A1* | 9/2017 | Soeno | | H01L 23/5283 |
| 2017/0268475 A1* | 9/2017 | Ishii | | F02P 3/0554 |

* cited by examiner

SEMICONDUCTOR DEVICE WITH A GATE INSULATING FILM FORMED ON AN INNER WALL OF A TRENCH, AND METHOD OF MANUFACTURING THE SAME

TECHNICAL FIELD

This disclosure relates to a semiconductor device and a method of manufacturing the same.

BACKGROUND

There is a semiconductor device which has a transistor such as a power metal-oxide-semiconductor field-effect transistor (MOSFET) or an insulated gate bipolar transistor (IGBT) in which a gate insulating film is formed on an inner wall of a trench formed in a front surface of a semiconductor substrate.

US 2015/0021623 discloses a MOSFET in which a gate insulating film including an oxide film, a nitride film, or a laminate structure of the oxide film and the nitride film is formed on an inner wall of a trench.

JP-A 2001-210821 discloses a transistor in which a gate insulating film having a laminate structure of an oxide film, a nitride film, and an oxide film is formed on a bottom of a trench and a gate insulating film including an oxide film is formed on sidewalls of the trench.

SUMMARY

In the configuration disclosed in US 2015/0021623, the gate insulating film formed on sidewalls of the trench includes the nitride film, and thus charge mobility is decreased.

As disclosed in JP-A 2001-210821, when the gate insulating film including the oxide film is formed on the sidewalls of the trench by thermal oxidation, a source region of the transistor is oxidized and shrunk at the time of formation of the gate insulating film. In consideration of the shrinkage, it is necessary to form the source region from the front surface to a deep position of the semiconductor substrate, thereby increasing manufacturing costs.

It is also considered that the gate insulating film including the oxide film may be formed by, for example, a chemical vapor deposition (CVD), other than the thermal oxidation.

In this case, the oxide film is also formed on the front surface of the semiconductor substrate, and an interlayer insulating film such as a BPSG (Boron Phosphorus Silicon Glass) film is formed on the oxide film.

As described above, in the configuration where the insulating film formed on the front surface of the semiconductor substrate includes the oxide film, there is a possibility that penetration of moisture or ions into the semiconductor substrate from the outside cannot be suppressed, thereby causing characteristic deterioration of the transistor.

This disclosure is to provide a semiconductor device capable of suppressing penetration of moisture or ions into the semiconductor substrate and ensuring sufficiently charge mobility to improve reliability and a method of manufacturing the same.

A semiconductor device of this disclosure: a semiconductor substrate, which includes: a drift region that has a first conductivity type; a body region that has a second conductivity type and is formed on the drift region, the second conductivity type being opposite to the first conductivity type; and an impurity region that has the first conductivity type and is formed inward from a surface of the body region; a trench, which is formed on a front surface of the semiconductor substrate and reaches the drift region; a control electrode, which is formed in the trench; an oxide film, which is formed between an inner wall of the trench and the control electrode; an electrode, which is connected to the impurity region; and a transistor, which includes a nitride film formed on the front surface of the semiconductor substrate excluding an upper side of the control electrode and a formation position of the electrode, in the semiconductor substrate.

A method of manufacturing a semiconductor device having a transistor of this disclosure includes: forming a semiconductor substrate that includes a drift region that has a first conductivity type; a body region that has a second conductivity type and is formed on the drift region, the second conductivity type being opposite to the first conductivity type; and an impurity region that has the first conductivity type and is formed inward from a surface of the body region; forming a nitride film on a front surface of the semiconductor substrate; patterning the nitride film and the semiconductor substrate and forming a trench on the front surface of the semiconductor substrate to reach the drift region; forming an oxide film on an inner wall of the trench; forming a control electrode in the trench, on which the oxide film is formed; exposing a portion of the impurity region; and forming an electrode to be connected to the portion of the impurity region.

According to this disclosure, it is possible to provide a semiconductor device capable of suppressing penetration of moisture or ions into the semiconductor substrate and ensuring sufficiently charge mobility to improve reliability and a method of manufacturing the same.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Embodiments of this disclosure will be described below with reference to the accompanying drawings.

Figure 1:
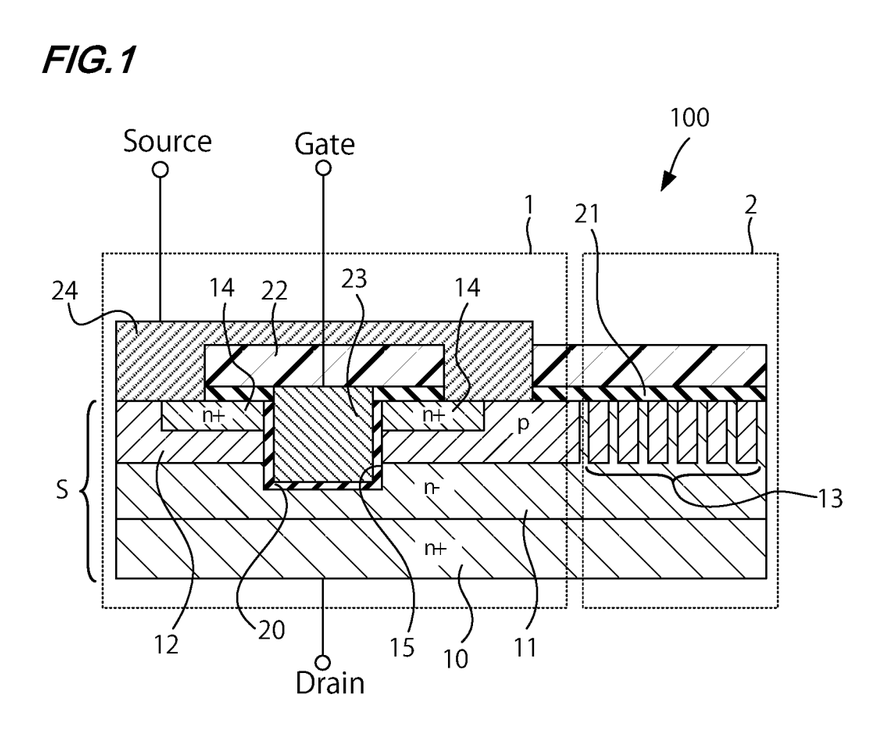
FIG. 1 is a schematic cross-sectional view illustrating a schematic configuration of a semiconductor device 100 according to an embodiment of this disclosure.

FIG. 1 is a schematic cross-sectional view illustrating a schematic configuration of a semiconductor device 100 according to an embodiment of this disclosure. The semiconductor device 100 includes at least a transistor such as a MOSFET or an IGBT having a trench gate structure.

The semiconductor device 100 includes a MOSFET 1 and a guard ring 2 to ensure a withstand voltage of the semiconductor device 100, and these components are provided with a semiconductor substrate S made of a semiconductor such as silicon carbide (SiC). The semiconductor device 100 may be configured to include a plurality of MOSFETs 1.

The semiconductor substrate S includes a front surface serving as an upper surface in FIG. 1 and a back surface serving as a lower surface in FIG. 1. In the following description, out of a thickness direction being an aligned direction of the back surface and the front surface of the semiconductor substrate S, a direction toward the front surface from the back surface is defined as an upward direction, and a direction toward the back surface from the front surface is defined as a downward direction.

The semiconductor substrate S included in the MOSFET 1 is configured with an n-type substrate 10 made of a semiconductor such as silicon or silicon carbide (SiC), an n-type drift region 11 that is formed on the substrate 10 and has a lower impurity concentration than the substrate 10, a p-type body region 12 that is formed on the drift region 11, and a pair of n-type impurity regions 14 that is formed toward the inside from the surface of the body region 12 and has a higher impurity concentration than the drift region 11.

Each of the drift region 11 and the body region 12 may be configured to have a structure in which a plurality of layers having different impurity concentrations are laminated.

The impurity region 14 constitutes a source region of the MOSFET 1. In the MOSFET 1, the substrate 10 constitutes a drain region of the MOSFET 1. Although not being illustrated in the drawings, a drain electrode made of a metal material such as aluminum or titanium is formed on the back surface of the semiconductor substrate S.

The semiconductor substrate S included in the guard ring 2 is configured with the substrate 10, the drift region 11 that is formed on the substrate 10, and a plurality of p-type impurity regions 13 that are formed toward the inside from the surface of the drift region 11. Each of the p-type impurity regions 13 is a ring-shaped region that is formed to surround the MOSFET 1.

The MOSFET 1 includes a trench 15 that is formed on the front surface of the semiconductor substrate S and reaches the drift region 11, a gate electrode 23 that is partially or totally formed in the trench 15, an oxide film 20 that is formed between an inner wall of the trench 15 and the gate electrode 23 and functions as a gate insulating film, a source electrode 24 that is made of a conductive material such as aluminum or titanium and is connected to each of the pair of impurity regions 14, and a nitride film 21 that is formed on the front surface of the semiconductor substrate S and has openings formed between the upper side of the gate electrode 23 and a formation position of the source electrode 24 in the semiconductor substrate S.

The gate electrode 23 is a control electrode used to control an applied voltage, and is made of a conductive material such as polysilicon. By the control of the voltage to be applied to the gate electrode 23, a channel is formed in the body region 12 adjacent to the trench 15, and charges can be transferred to the substrate 10, which is a drain region, from the impurity region 14 through the drift region 11.

An interlayer insulating film 22 including a BPSG film, a PSG film, or the like is formed on the gate electrode 23 and the nitride film 21. The gate electrode 23 is insulated from the source electrode 24 by the interlayer insulating film 22 and the nitride film 21.

The gate electrode 23 is formed beyond the front surface of the semiconductor substrate S in FIG. 1, but may be buried in the semiconductor substrate S. In this configuration, the interlayer insulating film 22 is filled up to an upper surface of the gate electrode 23 in the semiconductor substrate S.

The oxide film 20 is an insulating film made of, for example, silicon dioxide ($SiO_2$). The oxide film 20 is formed by thermal oxidation of the inner wall of the trench formed in the semiconductor substrate S. A thickness of the oxide film 20 is set to, for example, a value in the range from 50 nm to 100 nm according to characteristics of the transistor.

The nitride film 21 is an insulating film made of silicon nitride (SiN), for example, and having high moisture or ion blocking performance. The SiN means a material having a composition $Si_xN_y$, represented by $Si_3N_4$.

The nitride film 21 is formed to the front surface of the semiconductor substrate S included in the guard ring 2. In this way, the nitride film 21 is formed on the front surface of the semiconductor substrate S excluding the upper side of the gate electrode 23 and the formation position of the source electrode 24 in the semiconductor substrate S.

A method of manufacturing the semiconductor device 100 configured as above will be described below.

FIGS. 2A to 2G are schematic cross-sectional views illustrating manufacturing processes of the semiconductor device 100 illustrated in FIG. 1.

Figure 2A:
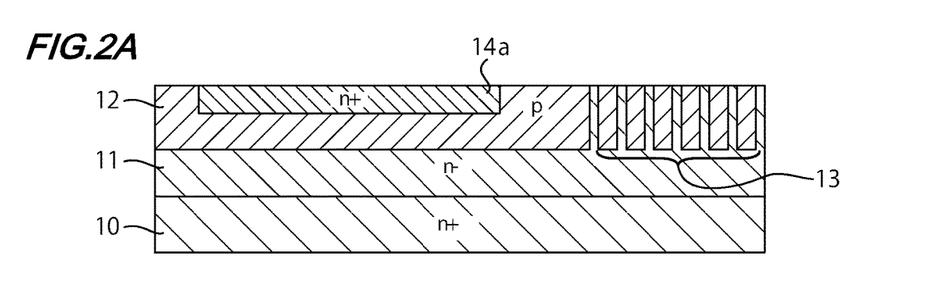
FIG. 2A is a schematic cross-sectional view illustrating a manufacturing process of the semiconductor device 100 illustrated in FIG. 1.

As illustrated in FIG. 2A, the drift region 11 is formed on the substrate 10 by, for example, epitaxial growth or ion implantation, the body region 12 and the plurality of impurity regions 13 are formed on the surface of the drift region 11 by ion implantation or the like, and an n-type impurity region 14a is formed on the surface of the body region 12 by ion implantation or the like, thereby forming the semiconductor substrate S. The process of forming the semiconductor substrate S is not limited thereto, and may employ a known method.

Figure 2B:
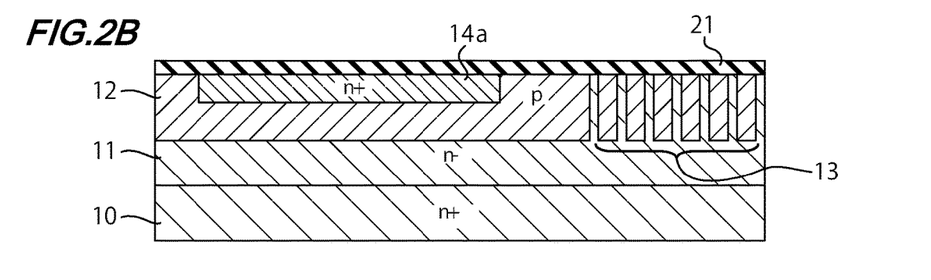
FIG. 2B is a schematic cross-sectional view illustrating a manufacturing process of the semiconductor device 100 illustrated in FIG. 1.

Subsequently, as illustrated in FIG. 2B, SiN is deposited on the front surface of the semiconductor substrate S by, for example, a plasma CVD method or a sputtering method, and the nitride film 21 is formed. At this time, the nitride film 21 is formed up to the front surface of the semiconductor substrate S in the guard ring 2.

Next, a mask pattern is formed on the nitride film 21 by, for example, a photolithography method. The mask pattern is a pattern having the opening at a position at which the impurity region 14a is divided into two parts in a plan view.

Figure 2C:
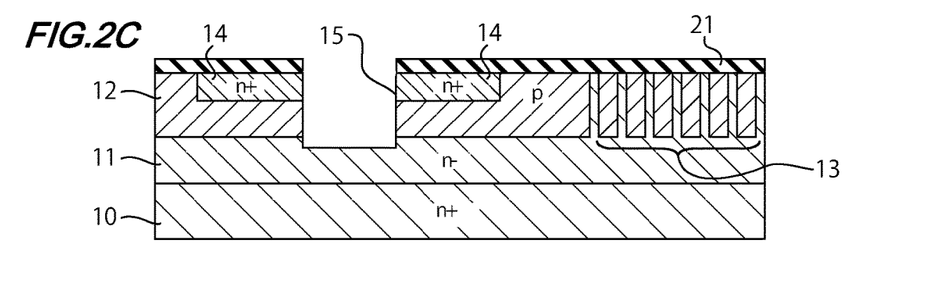
FIG. 2C is a schematic cross-sectional view illustrating a manufacturing process of the semiconductor device 100 illustrated in FIG. 1.

Then, the nitride film 21 and the semiconductor substrate S are etched by using the mask pattern and thus are subjected to patterning, and the trench 15 is formed to reach the drift region 11 from the front surface of the semiconductor substrate S, as illustrated in FIG. 2C.

The impurity region 14a is divided into two parts by the trench 15, and thus the pair of impurity regions 14 are formed as illustrated in FIG. 1.

Figure 2D:
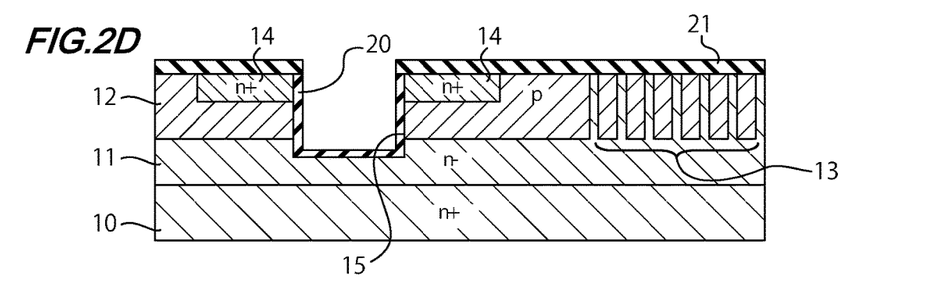
FIG. 2D is a schematic cross-sectional view illustrating a manufacturing process of the semiconductor device 100 illustrated in FIG. 1.

Subsequently, the semiconductor substrate S, in which the trench 15 is formed, is subjected to thermal oxidation, and thus the oxide film 20 is formed on the inner wall (side surface and bottom surface) of the trench 15 as illustrated in FIG. 2D.

Figure 2E:
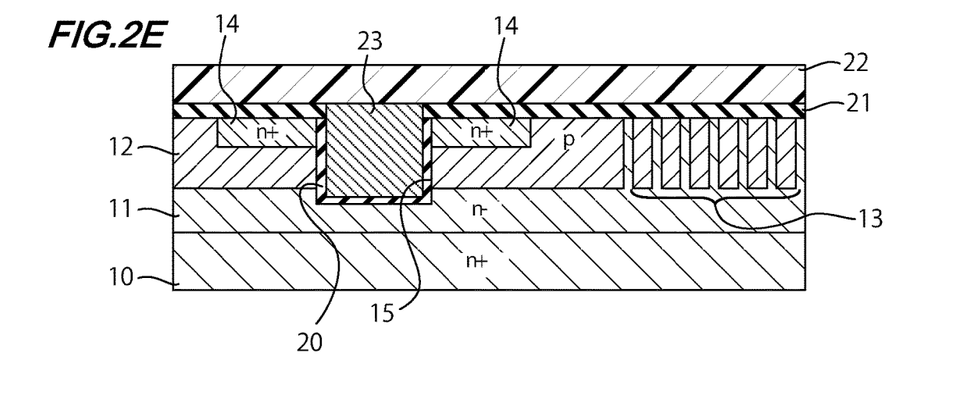
FIG. 2E is a schematic cross-sectional view illustrating a manufacturing process of the semiconductor device 100 illustrated in FIG. 1.

Subsequently, as illustrated in FIG. 2E, for example, a silicon-based conductive material such as polysilicon is deposited in the interior of the trench 15 on which the oxide film 20 is formed and in the opening of the nitride film 21 located above the interior, by using a plasma CVD method or a sputtering method, thereby forming the gate electrode 23. After formation of the gate electrode 23, the interlayer insulating film 22 including a BPSG film or a PSG film is formed on the nitride film 21 and the gate electrode 23 by using a CVD method, for example.

Next, a mask pattern is formed on the interlayer insulating film 22 by using a photolithography method, for example. This mask pattern is a pattern having openings located above at least two impurity regions 14 and the body region 12.

Figure 2F:
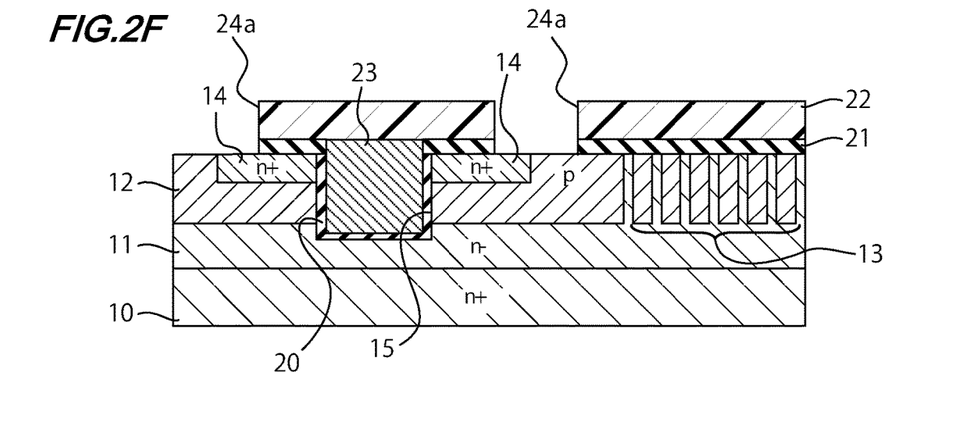
FIG. 2F is a schematic cross-sectional view illustrating a manufacturing process of the semiconductor device 100 illustrated in FIG. 1.

Subsequently, as illustrated in FIG. 2F, openings 24a are formed in the nitride film 21 and the interlayer insulating film 22 located above the impurity region 14 and the body region 12, by using the mask pattern, and thus a portion of each impurity region 14 and a portion of the body region 12 are exposed.

Figure 2G:
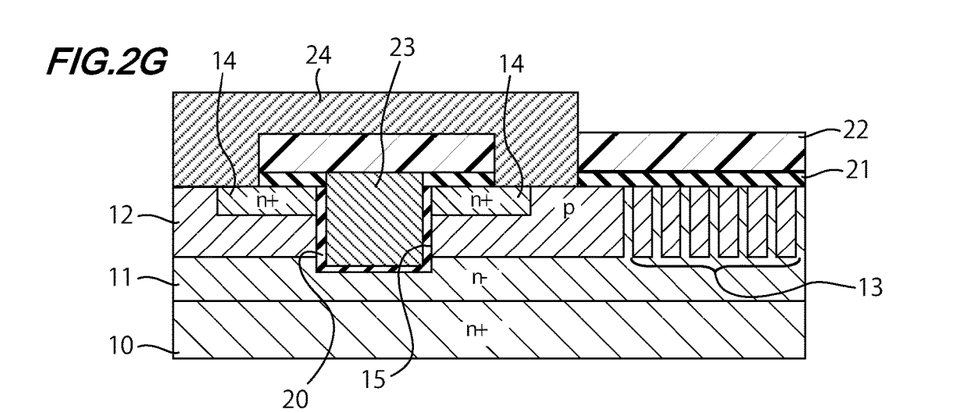
FIG. 2G is a schematic cross-sectional view illustrating a manufacturing process of the semiconductor device 100 illustrated in FIG. 1.

Next, as illustrated in FIG. 2G, the openings 24a are filled with a metal material such as aluminum or titanium, by using a sputtering method or a CVD method, and thus the source electrode 24 is formed to be connected to the exposed portion of the impurity region 14 and the exposed portion of the body region 12.

As described above, according to the semiconductor device 100, the nitride film 21 is formed on the front surface of the semiconductor substrate S, and thus there is no region where the oxide film is directly formed on the front surface of the semiconductor substrate S. Accordingly, it is possible to suppress penetration of moisture or ions from the interlayer insulating film 22 and to improve reliability of the device.

Further, according to the semiconductor device 100, the gate insulating film is configured with only the oxide film 20. Accordingly, it is possible to sufficiently ensure charge mobility and form the gate insulating film with high reliability.

According to the semiconductor device 100, as illustrated in FIG. 2D, it is possible to form the oxide film 20 by oxidizing the inner wall of the trench 15 in a state where the surface of the impurity region 14 is covered with the nitride film 21.

Thus, during the formation of the oxide film 20, the impurity region 14 can be suppressed from being oxidized and shrunk. Consequently, it is possible to simplify the ion implantation process used to form the impurity region 14a illustrated in FIG. 2A and to reduce manufacturing costs.

Figure 3:
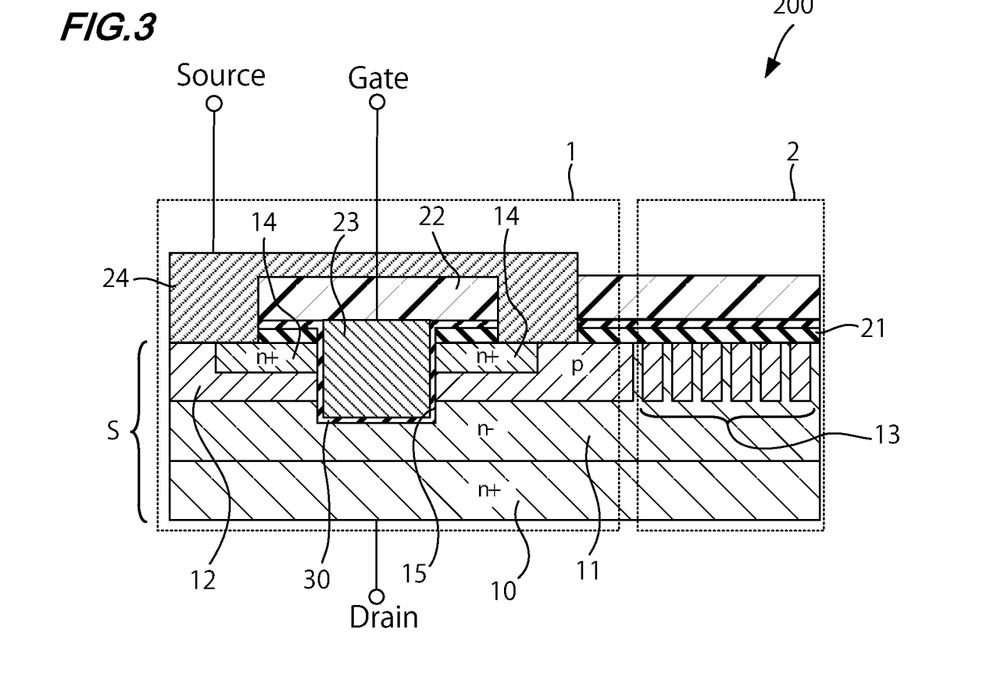
FIG. 3 is a schematic cross-sectional view illustrating a schematic configuration of a semiconductor device 200 according to a modified example of the semiconductor device 100 illustrated in FIG. 1.

FIG. 3 is a schematic cross-sectional view illustrating a schematic configuration of a semiconductor device 200 according to a modified example of the semiconductor device 100 illustrated in FIG. 1.

The semiconductor device 200 has the same configuration as that of the semiconductor device 100 except that the gate insulating film of the MOSFET 1 is formed by the oxide film 30, and the oxide film 30 is formed to cover the surface of the nitride film 21 outside the trench 15.

The oxide film 30 is an insulating film made of, for example, silicon dioxide ($SiO_2$). A material is deposited on the inner wall of the trench formed on the semiconductor substrate S by using a CVD method, and thus the oxide film 30 is formed. A thickness of the oxide film 30 is set to, for example, a value in the range from 50 nm to 100 nm according to characteristics of the transistor.

A method of manufacturing the semiconductor device 200 configured as above will be described below.

FIGS. 4A to 4G are schematic cross-sectional views illustrating manufacturing processes of the semiconductor device 200 illustrated in FIG. 3. The processes until the trench 15 is formed on the semiconductor substrate S are similar to those of the semiconductor device 100, and thus the description thereof is not presented.

Figure 4A:
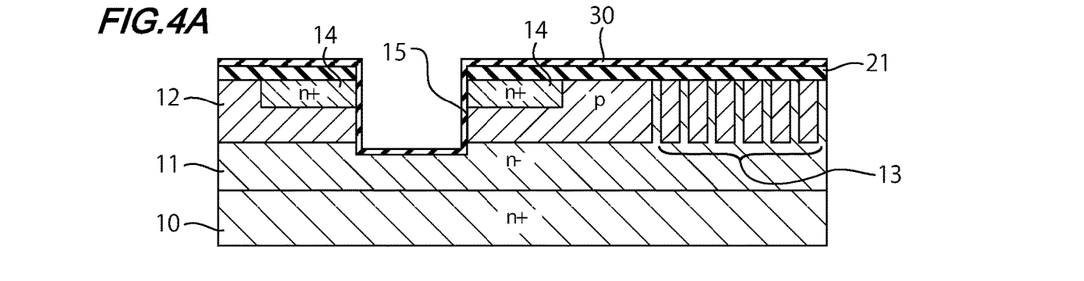
FIG. 4A is a schematic cross-sectional view illustrating a manufacturing process of the semiconductor device 200 illustrated in FIG. 3.

After the trench 15 is formed, as illustrated in FIG. 4A, silicon dioxide is deposited on the front surface of the semiconductor substrate S, in which the trench 15 is formed, by using a CVD method, thereby forming the oxide film 30.

Figure 4B:
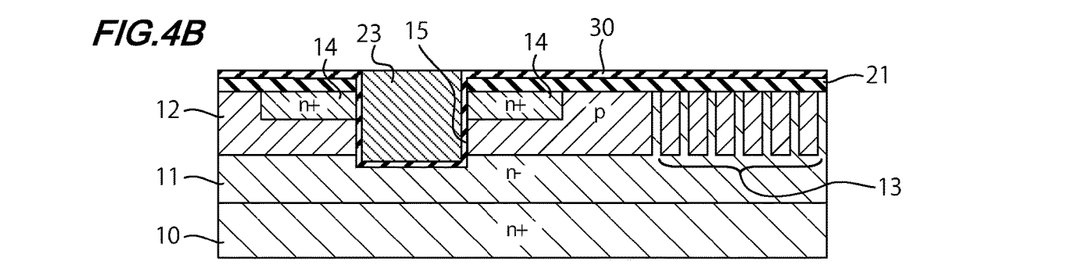
FIG. 4B is a schematic cross-sectional view illustrating a manufacturing process of the semiconductor device 200 illustrated in FIG. 3.

Subsequently, as illustrated in FIG. 4B, a silicon-based conductive material such as polysilicon is deposited in the interior of the trench 15 formed with the oxide film 30 and also above the interior by using a plasma CVD method, a sputtering method, or the like, thereby forming a gate electrode 23.

Figure 4C:
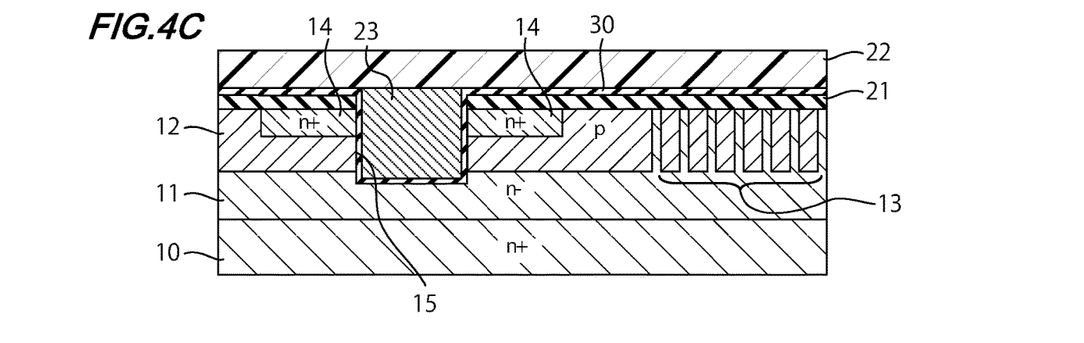
FIG. 4C is a schematic cross-sectional view illustrating a manufacturing process of the semiconductor device 200 illustrated in FIG. 3.

Next, as illustrated in FIG. 4C, an interlayer insulating film 22 including a BPSG film or a PSG film is formed on the oxide film 30 and the gate electrode 23 by using a CVD method, for example.

Subsequently, a mask pattern is formed on the interlayer insulating film 22 by using a photolithography method, for example. The mask pattern is a pattern having openings located above at least two impurity regions 14 and a body region 12.

Figure 4D:
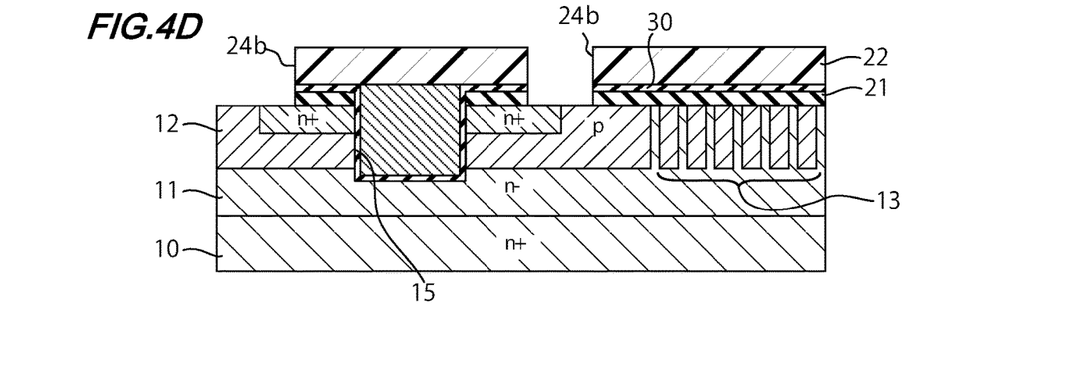
FIG. 4D is a schematic cross-sectional view illustrating a manufacturing process of the semiconductor device 200 illustrated in FIG. 3.

Next, as illustrated in FIG. 4D, opening 24b are formed in a nitride film 21, the oxide film 30, and the interlayer insulating film 22 which are located above the impurity region 14 and the body region 12, by using the mask pattern, and thus a portion of the respective impurity regions 14 and a portion of the body region 12 are exposed.

Subsequently, the opening 24b are filled with a metal material such as aluminum or titanium by using a sputtering method or a CVD method, and thus a source electrode 24 is formed to be connected to the exposed portion of the impurity region 14 and the exposed portion of the body region 12. By these processes, the semiconductor device 200 illustrated in FIG. 3 is formed.

As described above, according to the semiconductor device 200, the nitride film 21 is formed on the front surface of the semiconductor substrate S, and thus there is no region where the oxide film is directly formed on the front surface of the semiconductor substrate S. Accordingly, it is possible to suppress penetration of moisture or ions from the interlayer insulating film 22 and to improve reliability of the device.

Further, according to the semiconductor device 200, the gate insulating film is configured with only the oxide film 30. Accordingly, it is possible to sufficiently ensure charge mobility and form the gate insulating film with high reliability.

Moreover, according to the semiconductor device 200, the oxide film 30 is formed by using the CVD method. Therefore, it is possible to suppress shrinkage of the impurity region in the semiconductor substrate S, and to simplify the manufacturing processes.

In the semiconductor device 100 or the semiconductor device 200, it is preferable, from the viewpoint of ensuring moisture or ion blocking performance, that the thickness of the nitride film 21 be larger than that of the oxide film 20 or oxide film 30. Specifically, the thickness of the nitride film 21 is preferably set to a value larger than 100 nm.

When the thickness of the nitride film 21 is too large, cracks occurs in the film, and thus moisture or ion blocking performance may be deteriorated. Therefore, the upper limit value of the thickness of the nitride film 21 is preferably set to be about 500 nm.

In the semiconductor device 100 or the semiconductor device 200, the nitride film 21 is formed over the entire surface of the semiconductor substrate S excluding the upper side of the region where the gate electrode 23 is buried in the semiconductor substrate S and the location at which the source electrode 24 is formed, and an area ratio of the nitride film 21 to a chip area of the semiconductor device 100 is large.

Since the nitride film has high permittivity, a too large thickness thereof causes an increase in capacity. In the viewpoint of suppressing the increase in capacity and thus suppressing deterioration of characteristics of the semiconductor device 100 or the semiconductor device 200, it is preferable that the thickness of the nitride film 21 be set to be smaller than that of the oxide film 20 or the oxide film 30. Specifically, the thickness of the nitride film 21 is preferably set to be less than 100 nm, and more preferably set to be less than 50 nm.

As the transistor included in the semiconductor device 100 or 200, the MOSFET is exemplified in the above description. However, even when the transistor is an IGBT, the similar effects can be obtained with the similar configuration.

In addition, even when the semiconductor device 100 or 200 is configured such that the p-type and the n-type of the regions and the substrate 10 in the semiconductor substrate S are reversed, the similar effects can be obtained.

What is claimed is:

1. A semiconductor device comprising:
    a semiconductor substrate, which includes:
        a drift region that has a first conductivity type;
        a body region that has a second conductivity type and is formed on the drift region, the second conductivity type being opposite to the first conductivity type; and
        an impurity region that has the first conductivity type and is formed inward from a surface of the body region;
    a trench, which is formed on a front surface of the semiconductor substrate and reaches the drift region;
    a control electrode, which is formed in the trench;
    an oxide film, which is formed between an inner wall of the trench and the control electrode;
    an electrode, which is connected to the impurity region;
    a transistor, which includes a nitride film formed on the front surface of the semiconductor substrate excluding an upper side of the control electrode and a formation position of the electrode, in the semiconductor substrate; and
    a guard ring, which is formed in the semiconductor substrate to surround the transistor and includes an impurity region having the second conductivity type,
    wherein the nitride film is formed on the front surface of the semiconductor substrate, in which the guard ring has formed.

2. The semiconductor device according to claim 1, wherein a thickness of the nitride film is smaller than a thickness of the oxide film.

3. The semiconductor device according to claim 2, wherein the thickness of the nitride film is less than 100 nm.

4. The semiconductor device according to claim 1, wherein a thickness of the nitride film is larger than a thickness of the oxide film.

5. The semiconductor device according to claim 4, wherein the thickness of the nitride film is larger than 100 nm.

6. The semiconductor device according to claim 1, wherein, in an outside of the trench, the nitride film covers a surface of the oxide film.

7. A method of manufacturing a semiconductor device having a transistor, comprising:
    forming a semiconductor substrate that includes a drift region that has a first conductivity type; a body region that has a second conductivity type and is formed on the drift region, the second conductivity type being opposite to the first conductivity type; and an impurity region that has the first conductivity type and is formed inward from a surface of the body region;
    forming a nitride film on a front surface of the semiconductor substrate;
    patterning the nitride film and the semiconductor substrate and forming a trench on the front surface of the semiconductor substrate to reach the drift region;
    forming an oxide film on an inner wall of the trench;
    forming a control electrode in the trench, on which the oxide film is formed;
    exposing a portion of the impurity region;
    forming an electrode to be connected to the portion of the impurity region; and
    forming, in the semiconductor substrate, a guard ring including an impurity region having the second conductivity type to surround a region where the transistor of the semiconductor substrate is formed,
    wherein, in the forming the nitride film, the nitride film is formed on the front surface of the semiconductor substrate, in which the guard ring has formed.

8. The method according to claim 7, wherein, in the forming the oxide film, the oxide film is formed by thermal oxidation.

* * * * *